United States Patent [19]
Shiba et al.

[11] Patent Number: 6,002,989
[45] Date of Patent: Dec. 14, 1999

[54] SYSTEM FOR QUALITY CONTROL WHERE INSPECTION FREQUENCY OF INSPECTION APPARATUS IS RESET TO MINIMIZE EXPECTED TOTAL LOSS BASED ON DERIVED FREQUENCY FUNCTION AND LOSS VALUE

[75] Inventors: Masataka Shiba, Yokohama; Kenji Watanabe, Ome; Toshimitsu Hamada, Yokohama; Seiji Ishikawa, Kawasaki; Naoki Go, Yokohama; Toshiaki Yachi, Saitama-ken; Tetsuya Watanabe, Honjo; Takahiro Jingu, Takasaki, all of Japan

[73] Assignees: Hitachi, Ltd.; Hitachi Electronics Engineering Co., Ltd., both of Tokyo, Japan

[21] Appl. No.: 08/831,298

[22] Filed: Apr. 1, 1997

[30] Foreign Application Priority Data

Apr. 2, 1996 [JP] Japan .................................. 8-080200

[51] Int. Cl.⁶ .................................................... G06F 15/18
[52] U.S. Cl. .................... 702/84; 356/237.4; 356/237.5; 702/118; 710/15; 710/18; 713/400
[58] Field of Search .................................. 364/550, 552, 364/468.16, 464, 464.1, 489, 151; 702/81–84, 181–184, 118, 31, 155; 324/270, 870.01; 356/237, 237.4, 237.5; 29/593; 395/500.19; 705/400; 713/400

[56] References Cited

U.S. PATENT DOCUMENTS

| | | | |
|---|---|---|---|
| 4,212,075 | 7/1980 | Cleversey | 364/580 |
| 5,274,434 | 12/1993 | Morioka | 356/237 |
| 5,345,393 | 9/1994 | Ueda | 364/489 |
| 5,408,405 | 4/1995 | Mozumder et al. | 364/151 |
| 5,459,855 | 10/1995 | Lelm | 395/550 |
| 5,608,660 | 3/1997 | Morgan et al. | 702/155 |
| 5,642,296 | 6/1997 | Saxena | 702/84 |
| 5,661,669 | 8/1997 | Mozumder et al. | 702/84 |
| 5,737,227 | 4/1998 | Greenfield | 364/464.1 |

FOREIGN PATENT DOCUMENTS

| | | |
|---|---|---|
| 55-149829 | 11/1980 | Japan . |
| 59-65428 | 4/1984 | Japan . |
| 4311256 | 4/1991 | Japan . |

OTHER PUBLICATIONS

Nurani, et al. "Optimizing Wafer Inspection Sampling Strategies", pp. 32–37, Feb. 1995.

*Primary Examiner*—Thomas C. Lee
*Assistant Examiner*—Chien Yuan
*Attorney, Agent, or Firm*—Antonelli, Terry, Stout & Kraus, LLP

[57] ABSTRACT

Inspection apparatuses of an inspection apparatus group are connected to a network and transfer inspected result to a data collection system. The same wafer selected from a specific process is inspected by the different inspection apparatuses and the inspected data are collected and analyzed to calculate a correlation degree among the inspection apparatuses. On the other hand, the course of occurrence of failures in the same process can be analyzed to thereby calculate an average occurrence frequency of failures. An optimum inspection apparatus and inspection frequency are successively obtained on the basis of calculated results of an inter-apparatus correlation degree calculation process and a failure occurrence frequency calculation process, so that a feeding method of wafers to the inspection apparatus group is indicated through an inspection apparatus group management system. In the manufacturing of electronic components, complicated conditions such as the optimum inspection apparatus to be applied, the inspection frequency and the like can be set easily and the expected total loss value can be minimized to improve the economical efficiency of inspection remarkably.

25 Claims, 15 Drawing Sheets

SYSTEM FOR QUALITY CONTROL WHERE INSPECTION FREQUENCY OF INSPECTION APPARATUS IS RESET TO MINIMIZE EXPECTED TOTAL LOSS BASED ON DERIVED FREQUENCY FUNCTION AND LOSS VALUE

BACKGROUND OF THE INVENTION

The present invention relates to a management method (or inspection method) of manufacturing electronic components such as semiconductor wafers, printed boards, TFT liquid crystal display units, plasma display units and boards for magnetic disks with high yield and a production management system.

In the manufacturing of electronic components such as semiconductor wafers, printed boards, TFT liquid crystal display units, plasma display units and magnetic disk boards, such components are becoming more miniaturized and complicated every year, and it is very important to ensure a high yield.

Main causes of degrading the yield involve (1) extraneous substances or defects in external appearance (including unusual growth of crystal, disconnection, short circuit or broken portion) and (2) failure in pattern formation (failure in width of a pattern or the like) caused by alignment error, focusing error, unusual thickness or etching trouble. In the mass production of electronic components, these failures occur dispersedly (for example, the failures occur in one wafer per many wafers separately in the manufacturing of semiconductor wafers) or continuously (for example, the failures occur once every many wafers continuously in the manufacturing of semiconductor wafers).

In order to prevent the dispersed failures or continuous failures, heretofore, inspection is made in the main process of the manufacture to detect failures and countermeasures for coping with the failures are taken.

By way of example, JP-A-55-149829 and JP-A-59-65428 disclose many methods of detecting minute extraneous substances existing on electronic components such as semiconductor wafers having patterns formed thereon. Various inspection apparatuses using these detection methods are developed and used in the manufacturing line.

The problem that the present invention is to solve is now described by taking the inspection of extraneous substances on wafers and defects in external appearance as an example.

When the same wafer is inspected by inspection apparatuses A and B having different detection systems and failure distribution maps are prepared on the basis of the coordinates of detected failures such as extraneous substances and defects in external appearance, the respective failure distribution maps are expressed as chips 101a and 101b of FIGS. 1 and 2, respectively. When the two failure distribution maps are collated with each other (overlapped on each other) to examine failures, the failures such as extraneous substances and defects in external appearance detected by both the inspection apparatuses A and B can be understood to be black dots 102a and 102b. It can be understood that the failures such as extraneous substances and defects in external appearance detected separately by only the inspection apparatus A or B are hatched circles 103a and 103b and the failures which cannot be detected by the apparatus A or B are circles 104a and 104b.

Thus, when a Ben's diagram is prepared on the basis of data examined by collating failure distribution maps detected by inspection apparatuses A, B, C and D having different detection systems with one another, the Ben's diagram is prepared as shown in FIG. 3. The detected results of the inspection apparatuses A, B, C and D are represented by circles 10, 11, 12 and 13, respectively, and the failures such as extraneous substances and defects in external appearance detected by all of the inspection apparatuses irrespective of the inspection system are represented by an overlapped portion of the circles (hatched portion).

The detection ratios of the failures such as, particularly, minute extraneous substances and defects in external appearance having the lowest possible detection sensitivity are different depending on the different detection methods as shown in FIG. 3. Consequently, even when an inspection apparatus is introduced with much effort and inspection is made by the apparatus, fatal failures cannot be detected under certain circumstances and numerous failures may sometimes occur. Accordingly, it is very important to select an optimum inspection apparatus in order to attain the high yield.

Further, even when the inspection apparatus to be used is determined, the inspection frequency is almost determined by the sense and experience of the engineer engaged in the manufacturing line and accordingly this is a large factor of impeding automatization of the management of the inspection processes.

SUMMARY OF THE INVENTION

It is an object of the present invention to provide a production management method capable of ensuring a high yield by provision of an inspection apparatus optimum to inspection processes in the manufacturing of electronic components such as semiconductor wafers, printed boards, TFT liquid crystal display units, plasma display units and magnetic disk boards and means for setting a frequency of inspection using the inspection apparatus, and a production management system having the function of the production management method.

The problems can be solved by providing a production management method comprising means for calculating a correlation in performance among a plurality of inspection apparatuses, means for calculating the interval of occurrence of failures statistically, means for setting an optimum inspection apparatus and a frequency of inspection using the optimum inspection apparatus on the basis of the correlation in performance among the apparatuses and the occurrence frequency of failures, and a system for managing how to feed objects to be inspected to the inspection apparatus group on the basis of the inspection frequency.

More particularly, in the manufacturing line of electronic components including a plurality of processing processes, the electronic components subjected to a predetermined processing process are extracted and inspected by means of a plurality of inspection apparatuses having different performances at respective predetermined frequencies to thereby manage manufacturing situations thereof.

The plurality of inspection apparatuses having different performances include, for example, an expensive inspection apparatus capable of making inspection with extremely high accuracy and an inexpensive inspection apparatus capable of making inspection with only usual accuracy. It is useless to use the inspection apparatus with high accuracy when the extremely high accuracy of inspection is not required, while if the inspection apparatus with low accuracy is used when the high accuracy of inspection is required, the efficiency in management of the manufacturing processes is deteriorated. Accordingly, it is important to install an inspection apparatus having performance pertinent to the required inspection accuracy.

More preferably, a plurality of electronic components fed to the processing process are extracted and inspected every predetermined number of electronic components by the plurality of inspection apparatuses and the inspection frequency for inspecting the electronic components every predetermined number thereof is set in the respective inspection apparatuses on the basis of the inspected result.

In this case, a function of the inspection frequency for the plurality of inspection apparatuses and the expected total loss value in case where inspection is made at the inspection frequency is derived from the inspected result and the inspection frequency may be set in each of the plurality of inspection apparatuses so that the expected total loss value is minimized.

When the inspection apparatus is fixed to manage the manufacturing line as in the prior art, defects capable of being detected by performance of the inspection apparatus are limited to some degree. Generally, the failure mode of the manufacturing line is varied with the elapse of time and accordingly even if it is judged that the inspected result of the inspection apparatus is normal (the management standard is satisfied), failures are sometimes fabricated actually due to defects which cannot be detected by the inspection apparatus.

The inspection apparatuses include, for example, an external appearance inspection apparatus and an extraneous substance inspection apparatus and a detection system of defects in each of the inspection apparatuses is different. Accordingly, there are defects detected in common by both the external appearance inspection apparatus and the extraneous substance inspection apparatus and defects detected by only one of them. Further, the inspection time required to detect the respective defects is also a problem. If the inspection frequency is increased, the throughput (inspection speed) of the whole manufacturing line is naturally reduced.

In the present invention, in view of the above problems, the plurality of inspection apparatuses having different performances are used to cope with variation of the failure mode rapidly. Further, a function of the inspection frequency of the inspection apparatus and the expected total loss value in case where inspection is made at the inspection frequency is derived and the inspection frequency for the plurality of inspection apparatuses is set in each of the inspection apparatuses so that the expected total loss value is minimized to thereby manufacture the electronic components effectively.

More particularly, by inspecting, for example, semiconductor wafers at a frequency of one wafer per ten wafers by means of, for example, the extraneous substance inspection apparatus and at the same time at a frequency of one wafer per hundred wafers by means of the external appearance inspection apparatus, defects detectable by the extraneous substance inspection apparatus and defects detectable by the external appearance inspection apparatus can be grasped. Accordingly, it is possible to cope with a novel failure mode rapidly and the electronic components can be manufactured effectively in consideration to the total manufacturing loss.

FIG. 4 schematically illustrates an idea of the present invention.

More particularly, in FIG. 4, a plurality of inspection apparatuses A to D having different performances and for inspecting, for example, semiconductor wafers are connected through a network 8 and failure mode data obtained by the inspection apparatuses such as, for example, sizes, features, positional coordinates and the total number of extraneous substances on the wafers are collected into a data collection system 2. The failure mode data are supplied to a data base 2 and when a predetermined term elapses, contents of the data base 3 are updated. The failure mode data are supplied from the data collection system 2 to inter-apparatus correlation degree calculation means 4 and failure occurrence frequency calculation means 5, which calculate a correlation degree among the inspection apparatuses and a failure occurrence frequency. There is provided means 6 for selecting an optimum inspection apparatus and calculating an optimum inspection frequency on the basis of the calculated result data of the calculation means 4 and 5. An inspection apparatus group management system 7 manages and controls the inspection apparatuses A to D on the basis of the calculated result of the optimum inspection apparatus/ optimum inspection frequency calculation means 6.

Inspection of failures such as extraneous substances on the semiconductor wafers and defects in external appearance is described by way of example. Since a recent extraneous substance inspection apparatus can inspect defects in external appearance by virtue of the advance of the image processing technique and can be positioned as a "scattering light detection type external appearance inspection apparatus", both of the inspection apparatuses are arranged to be hereinafter named an inspection apparatus.

It is assumed that the inspection apparatus group 1 including inspection apparatuses A, B, C and D having various (different) detection systems is installed in the manufacturing line of semiconductors. The inspection apparatuses are connected to the network 8 and inspected results are transferred to the data collection system 2 after completion of the inspection. The data collection system 2 includes a large-scale data base 2, which can be used upon analysis of the process history of the inspected result of the same wafer and change of failure occurrence in the same process.

When a specific failure mode is confirmed, inspection data obtained by inspecting the same wafer selected from a specific process by means of different inspection apparatuses of the inspection apparatus group 1 can be collected and analyzed to calculate the correlation degree among the inspection apparatuses (inter-apparatus correlation degree calculation process 4). On the other hand, the course of failure occurrence in the same process can be analyzed to calculate an average failure occurrence frequency (failure occurrence frequency calculation process 5). The optimum inspection apparatus and inspection frequency are successively calculated on the basis of the calculated results of the inter-apparatus correlation degree calculation process 4 and the failure occurrence frequency calculation process 5 (optimum inspection apparatus/inspection frequency calculation process 6). How to feed wafers to the inspection apparatus group 1 may be indicated and controlled through the inspection apparatus group management system 7.

DESCRIPTION OF THE PREFERRED EMBODIMENTS

Figure 1:
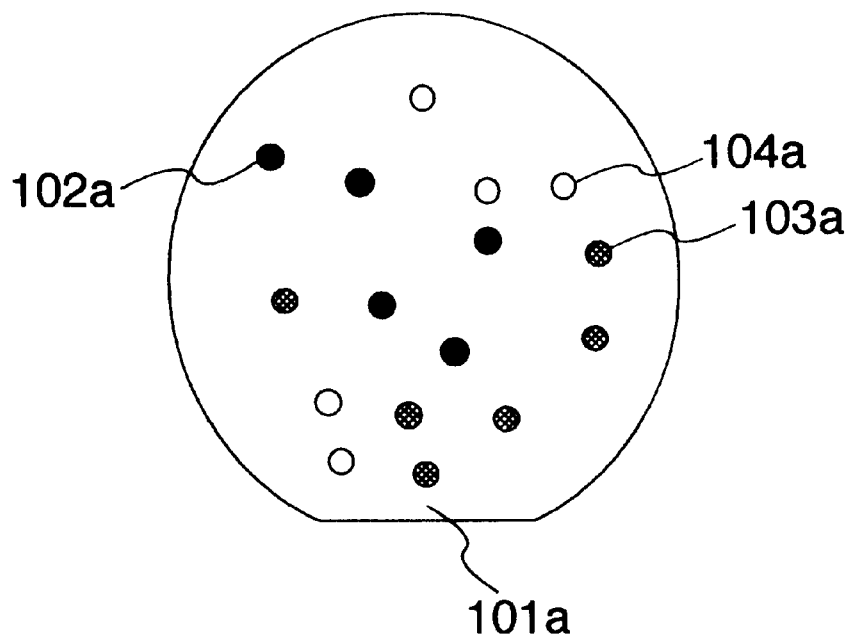
FIG. 1 is a plan view of a wafer showing the failure distribution map obtained by inspecting the wafer by a conventional inspection apparatus A for making inspection by a certain detection system.
Figure 2:
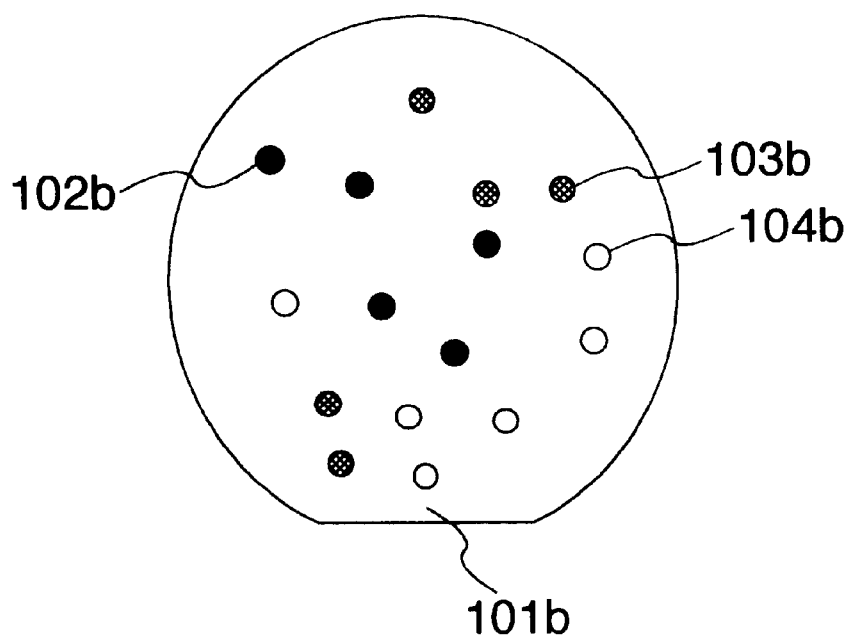
FIG. 2 is a plan view of a wafer showing the failure distribution map obtained by inspecting the wafer by a conventional inspection apparatus B having a detection system different from the inspection apparatus A.
Figure 3:
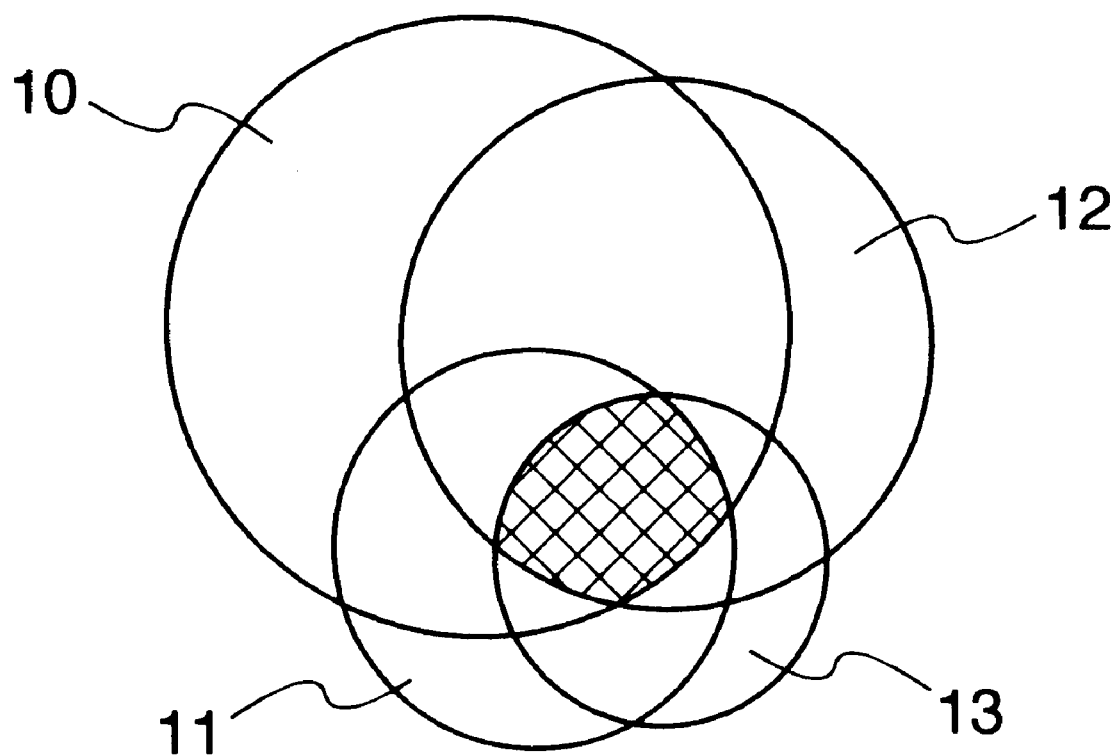
FIG. 3 is a Ben's diagram of failures inspected by means of the conventional inspection apparatuses A and B having different detection systems.
Figure 4:
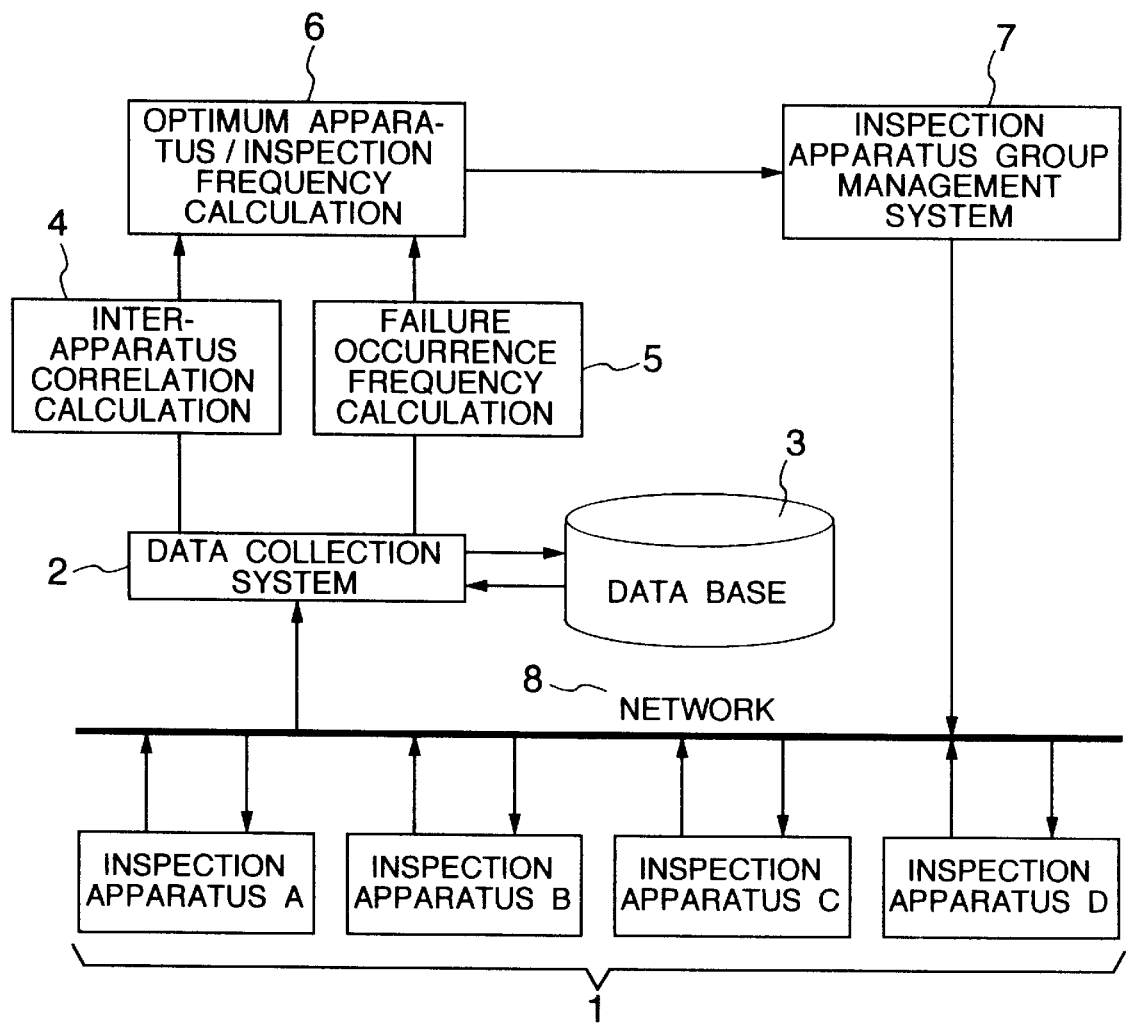
FIG. 4 is a schematic diagram illustrating a production management system of electronic components according to an embodiment of the present invention.

In FIG. 4 schematically illustrating a production management system of electronic components according to the present invention, a plurality of inspection apparatuses A to D having different performances and for inspecting, for example, semiconductor wafers are connected through a network 8, and failure mode data such as, for example, size and feature of extraneous substances, coordinates of positions of extraneous substances on the wafer and the total number of extraneous substances obtained by the respective inspection apparatuses are collected into a data collection system 2. The failure mode data are also supplied to a data base 3 and when a predetermined term elapses, contents of the data base 3 are updated. Inter-apparatus correlation degree calculation means 4 and failure occurrence frequency calculation means 5 are supplied with the failure mode data from the data collection system 2 and calculate correlation degrees among the inspection apparatuses and failure occurrence frequencies, respectively. There is provided means 6 for selecting an optimum apparatus and calculating an optimum inspection frequency on the basis of the calculated data from both the calculation means 4 and 5. An inspection apparatus group management system 7 manages and controls the inspection apparatuses A to D on the basis of the calculated result from the calculation means 6.

Referring now to FIGS. 5 to 12, an embodiment of the inter-apparatus correlation degree calculation process 4 is described by using two different inspection apparatuses as models.

As described above, when the same wafer is inspected by the inspection apparatuses A and B having different detection systems to prepare failure distribution maps on the basis of coordinates of detected failures such as extraneous substances and defects in external appearance and the two failure distribution maps are collated with each other (overlapped on each other) to examine the failures, it can be understood that the failures can be classified into failures such as extraneous substances and defects in external appearance detected by both the inspection apparatuses A and B, failures detected by only one of the inspection apparatuses A and B and failures detected by only the other inspection apparatus.

In preparation of the failure distribution map, there are two methods, one of which uses all of the detected failures to prepare the map and the other uses failures of a specific failure mode on the basis of the reviewed (observed) result.

When the collated (overlapped) result of failures is displayed by the Ben's diagram, the Ben's diagram can be broadly classified into four cases as shown in FIGS. 5 to 8. The sizes of circles 10a to 10d and 11a to 11d represent the number of failures detected by the inspection apparatuses A and B, respectively. The areas of overlapped portions (hatched portions) 14a to 14d of two circles represent the number of failures detected in common by the inspection apparatuses A and B.

It is now defined that the numbers of failures detected by the inspection apparatuses A and B are Na and Nb, respectively, and the number of failures detected in common by both of them is Nab. The number Nall of failures detected by at least any one of the inspection apparatuses A and B is defined by the following equation (1):

$$Nall = Na + Nb - Nab \quad (1)$$

The presence of the correlation degree between the two apparatuses is calculated by the equations (2), (3) and (4). R1 represents a detection ratio of the inspection apparatus B to the number of failures detected by the inspection apparatus A (equation (2)). R2 represents a capture ratio of the inspection apparatus A to the total number of failures (equation (3)). R3 represents a detection ratio of common failures to the number of failures detected by the inspection apparatus A (equation (4)). Thresholds T1 to T3 (for example, 0.9 for each threshold) are set for the ratios R1 to R3, respectively.

$$R1 = Nb/Na \quad (2)$$

$$R2 = Na/Nall \quad (3)$$

$$R3 = Nab/Na \quad (4)$$

Figure 5:
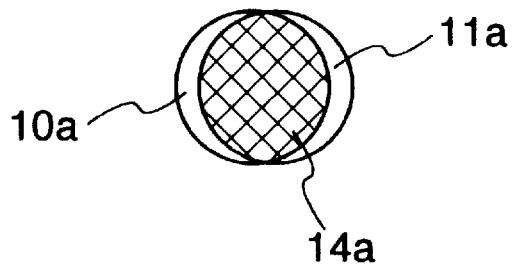
FIG. 5 is a Ben's diagram for calculating a correlation degree between inspection apparatuses on the basis of the number of detected failures in the embodiment.

FIG. 5 shows the case where all of the detection ratio R1 of the inspection apparatus B to the detection ratio of common failures exceed the thresholds T1 to T3, respectively. In other words, it is shown that both of the inspection apparatuses A and B possess substantially the same characteristic in term of the detection ratio, and selection of the inspection apparatus must be made in consideration of the economical efficiency.

Figure 6:
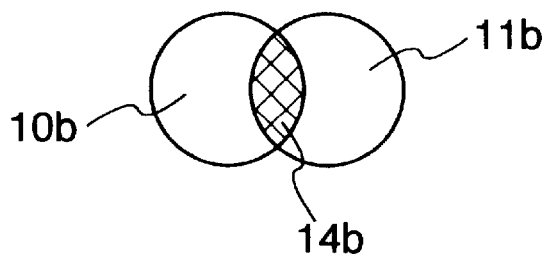
FIG. 6 is a Ben's diagram for calculating a correlation degree between inspection apparatuses on the basis of the number of detected failures in the embodiment.

FIG. 6 shows the case where R2 or R3 is smaller than or equal to the threshold T2 or T3, respectively. In other words, both of the inspection apparatuses A and B detect different failures due to difference of the detection methods thereof. In this case, when the mode of detected failures is different depending on the inspection apparatus, it is necessary to use both the inspection apparatuses or use the inspection apparatus which can detect failures of the failure mode having the higher importance in consideration of the relation of the failure mode and the lethality or fatal degree. When the modes of detected failures are the same, selection of the inspection apparatus is made in consideration of the capture ratio R2 and the economical efficiency.

Figure 7:
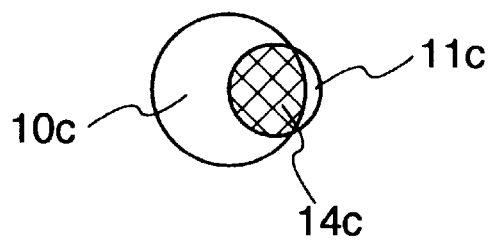
FIG. 7 is a Ben's diagram for calculating a correlation degree between inspection apparatuses on the basis of the number of detected failures in the embodiment.

FIG. 7 shows the case where R1 is smaller than or equal to the threshold T1 and accordingly R3 is also smaller than or equal to the threshold T3. In other words, the performance of the inspection apparatus A includes or covers the performance of the inspection apparatus B and selection of the inspection apparatus is made in consideration of the capture ratio R2 and the economical efficiency.

Figure 8:
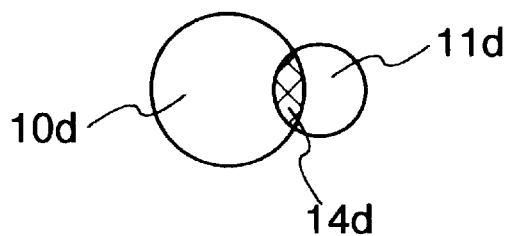
FIG. 8 is a Ben's diagram for calculating a correlation degree between inspection apparatuses on the basis of the number of detected failures in the embodiment.

FIG. 8 shows the case where all of R1 to R3 are smaller than or equal to the thresholds T1 to T3, respectively. When the mode of detected failures is different depending on the inspection apparatus, the relation of the mode of failures detected by the inspection apparatus B and the lethality is considered and when the importance of the failure mode is high, it is necessary to jointly make inspection using the inspection apparatus B. When the modes of detected failures are the same, selection of the inspection apparatus is made in consideration of the capture ratio R2 and the economical efficiency.

In the calculation of the correlation degrees between the inspection apparatuses using the Ben's diagram shown in FIGS. 5 to 8, only the number of detected failures is considered, while an example of the method of calculating the detailed correlation degree in consideration of the detected level is shown in FIGS. 9 to 12.

Figure 9:
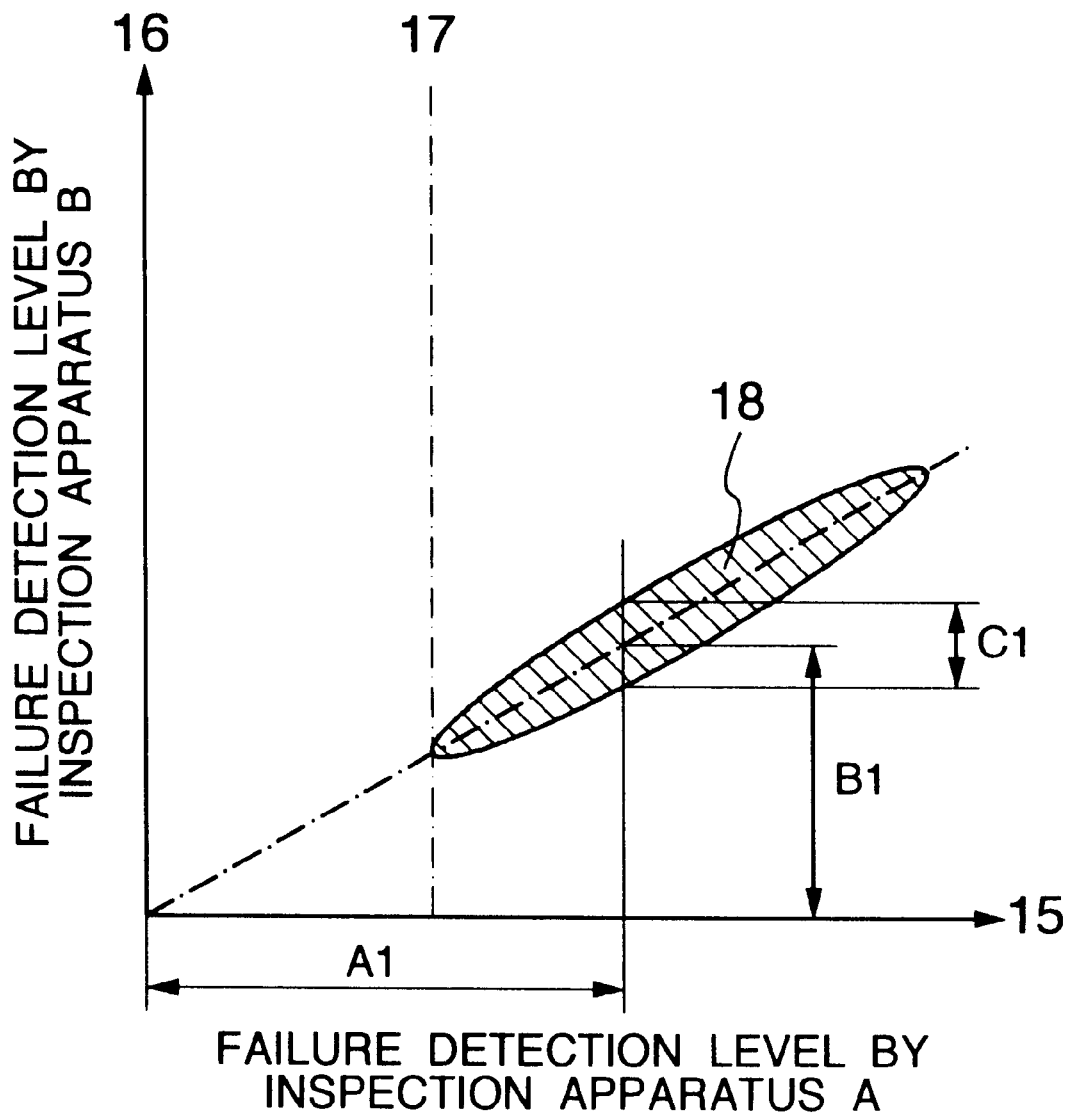
FIG. 9 is a graph for calculating a correlation degree between inspection apparatuses on the basis of detected levels in the embodiment.
Figure 10:
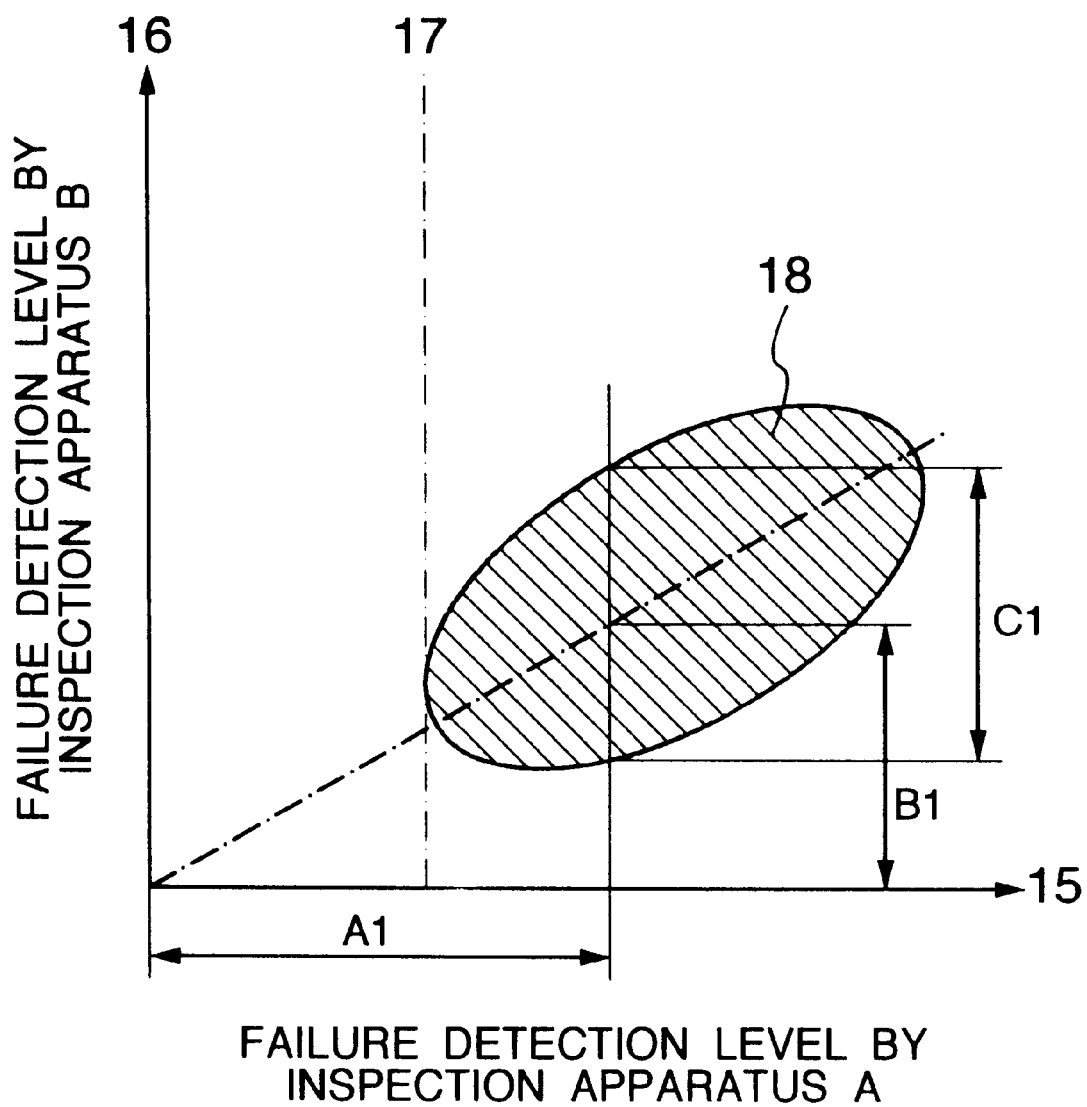
FIG. 10 is a graph for calculating a correlation degree between inspection apparatuses on the basis of detected levels in the embodiment.

When the two inspection apparatuses have correlation as the result of the analysis in the Ben's diagram as shown in FIG. 5 or 7, the distribution can be obtained as shown by 18 of the graphs of FIGS. 9 and 10 in which the failure detection levels (the intensity of scattering light or size of defects) of the inspection apparatuses A and B are taken for the axis of abscissas 15 and the axis of ordinates 16, respectively, and the common detection failures are plotted therein. In the graphs, numeral 17 represents a limit of detection in the inspection apparatus A.

The coefficient of inclination m calculated by the following equation (5) is the reduced or converted detection level of the inspection apparatus B with respect to the inspection apparatus A. The coefficient of inclination m is defined by a ratio of the failure detection levels A1 and B1 of the inspection apparatuses A and B shown in FIGS. 9 and 10.

$$m = B1/A1 \quad (5)$$

When the coefficient of dispersion d calculated by the following equation (6) is smaller than or equal to a predetermined threshold, the inspection apparatuses A and B can be treated as having the large correlation in the sensitivity. In FIGS. 9 and 10, C1 represents dispersion of the failure detection level B1 when failures of the failure detection level A1 detected by the inspection apparatus A1 is detected by the inspection apparatus B. The smaller the dispersion C1, the larger the correlation in the sensitivity and the smaller the coefficient of dispersion d as expressed in the equation (6):

$$d = C1/B1 \quad (6)$$

Figure 11:
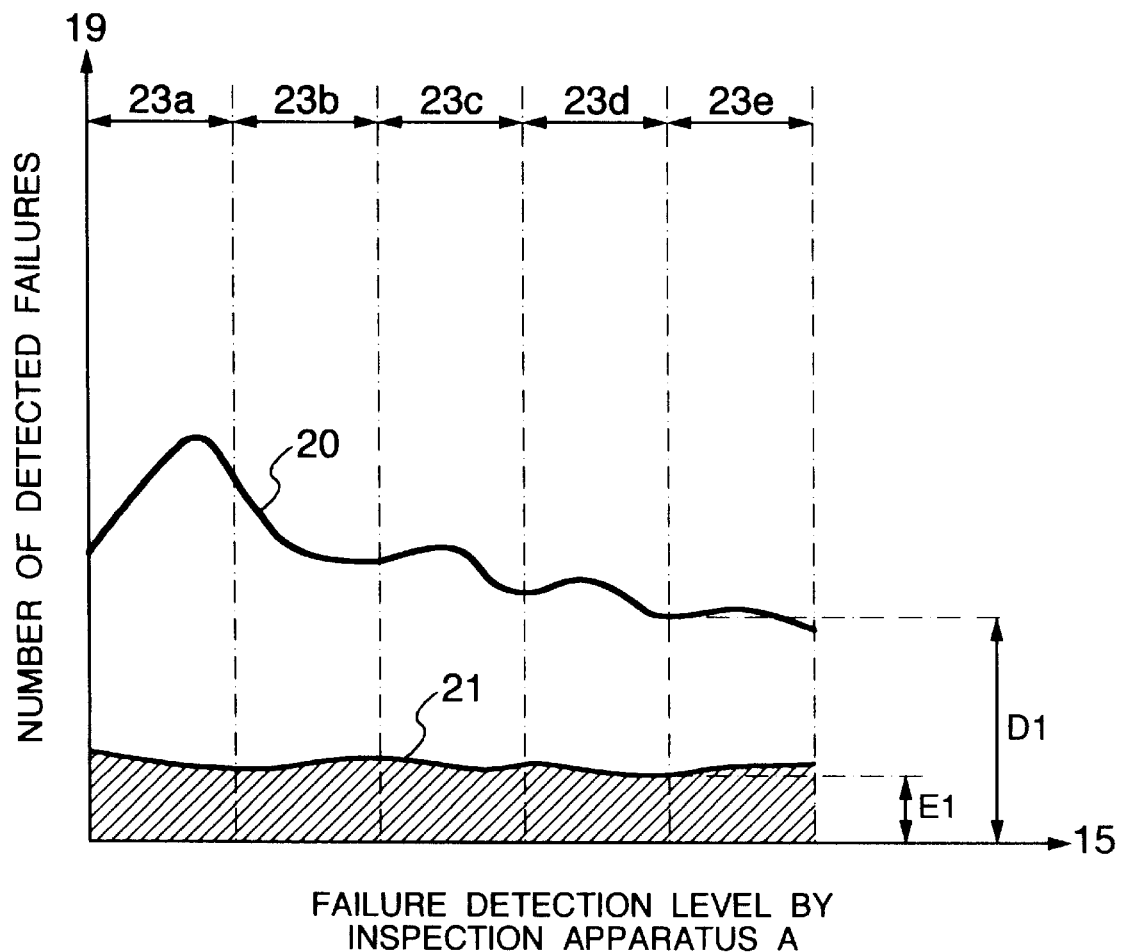
FIG. 11 is a graph for calculating a correlation degree between inspection apparatuses on the basis of the number of detected failures for each detection level in the embodiment.
Figure 12:
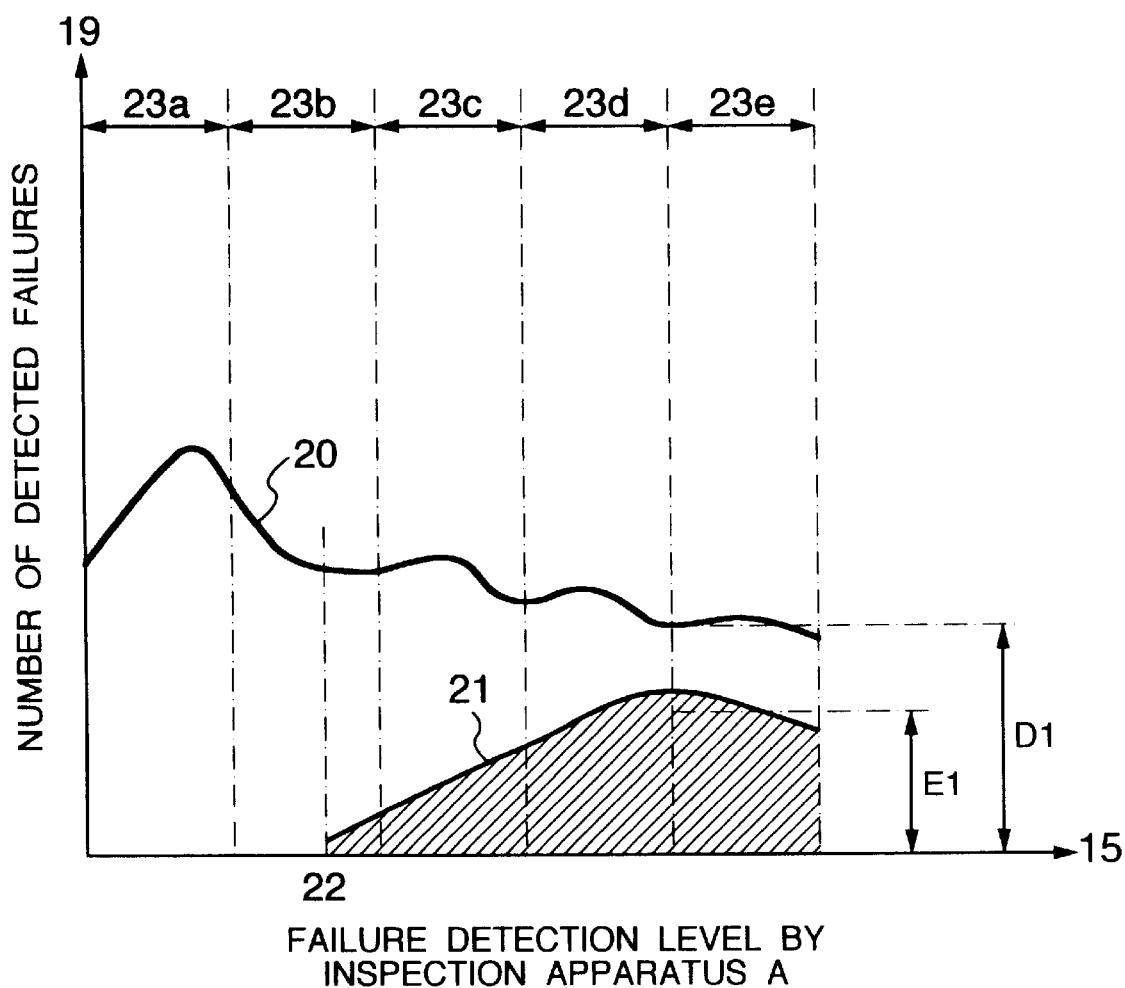
FIG. 12 is a graph for calculating a correlation degree between inspection apparatuses on the basis of the number of detected failures for each detection level in the embodiment.

When the two inspection apparatuses have correlation as the result of the analysis in the Ben's diagram as shown in FIG. 5 or 7, the failure detection level (the intensity of scattering light or size of defects) of the inspection apparatus A and the number of detected failures are taken for the axis of abscissas 15 and the axis of ordinates 19 as shown in FIGS. 11 and 12, respectively, and the detected result 20 by the inspection apparatus A and the common detection failures 21 detected by both the inspection apparatuses A and B within the detected result 20 are plotted therein. Thus, grouping is made as shown by 23a to 23e on the basis of the failure detection level and the average number D1 of detected failures by the inspection apparatus A and the number of the common detection failures E1 detected by both the apparatuses A and B within the average number D1 are calculated in each group. A coefficient R4 is calculated by the following equation (4):

$$R4 = E1/D1 \quad (7)$$

When the coefficients R4 in all the groups exceed a predetermined threshold as shown in FIG. 11, it can be understood that a difference between the inspection apparatuses A and B is a difference of the capture ratios. However, when the coefficient R4 of a particular group is smaller than the predetermined threshold, it indicates that the inspection apparatus B possesses the insensitive zone. For example, FIG. 12 shows that the inspection apparatus B cannot detect minutes failures smaller than a level 22 and particularly when the lethality in the minutes failures is regarded as important, it is impossible to select the inspection apparatus B.

The occurrence frequency calculation process 5 of FIG. 4 can use the method of calculating a MTBF (Mean Time Between Failure) used in the analysis of failures in an equipment.

An embodiment of the calculation means 6 for selecting an optimum apparatus and calculating an inspection frequency on the basis of the calculated result of the Inter-apparatus correlation degree calculation process 4 and failure occurrence frequency calculation process 5 of FIG. 4 is now described.

Generally, there is a tendency that the inspection apparatus with the high capture ratio is expensive and has a low throughput while it is not suitable for the high frequency inspection and the inspection apparatus with the low capture ratio is inexpensive and has a high throughput while it cannot detect minute failures. Thus, in order to obtain the optimum inspection apparatus and inspection frequency, there has been invented a method of using an expected total loss value Ct (equation (8)) expressed by a sum of a cost Ci required for the inspection and an expected loss value Cf due to fabrication of failures as an index.

$$\text{Expected Total loss value } (Cf) = \text{Inspection Cost } (Ci) + \text{Expected Loss Value due to Fabricated Failures } (Cf) \quad (8)$$

Figure 13:
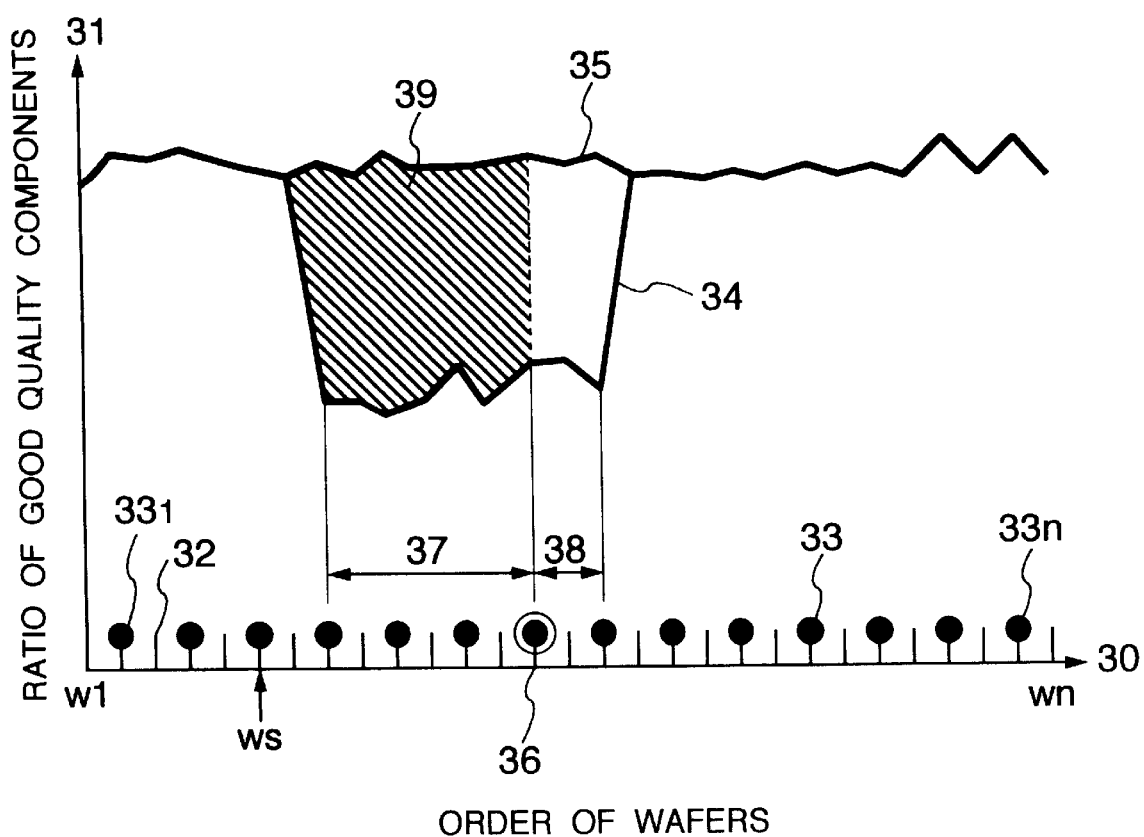
FIG. 13 is a graph explaining undetection of failures by inspection.
Figure 14:
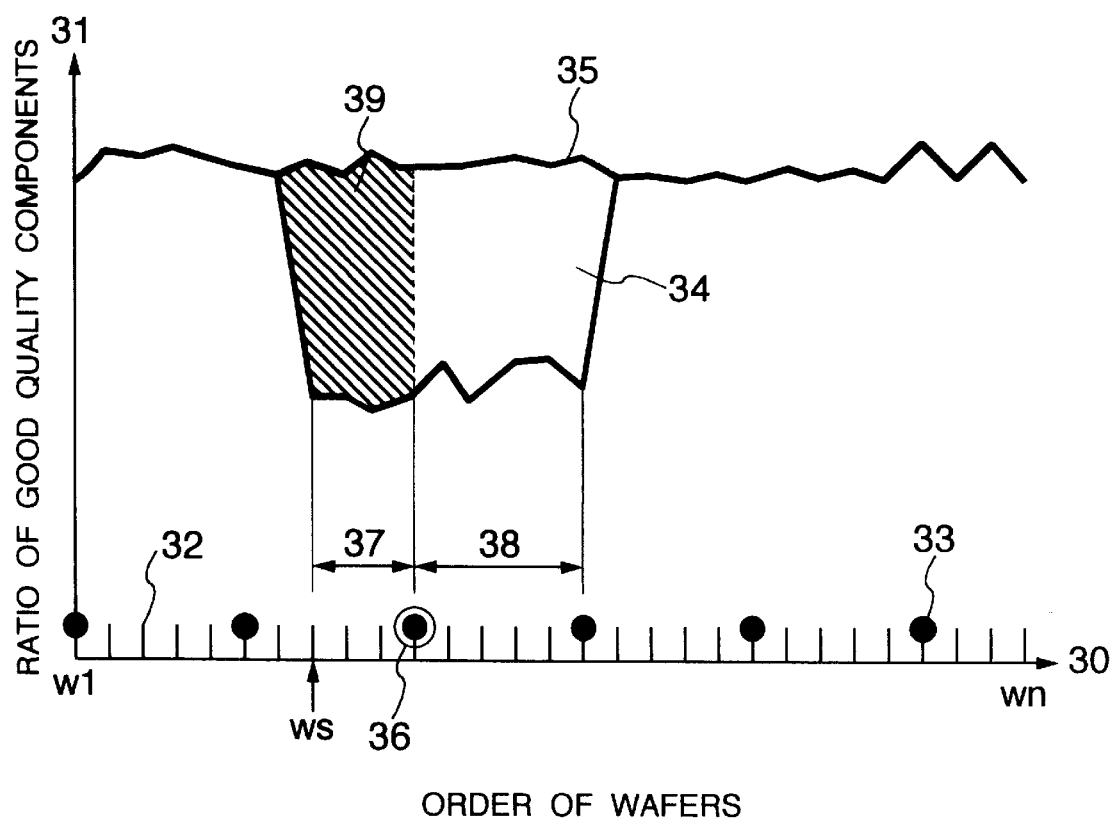
FIG. 14 is a graph explaining undetection of failures by inspection.

FIGS. 13 and 14 explain undetection of failures by the inspection.

FIG. 13 shows the case using the inspection apparatus having the low capture ratio. In FIG. 13, the axis of abscissas 30 represents a feeding order indicated by w1 to wn of wafers conveyed in the manufacturing line and a vertical bar or line 32 represents feeding of one wafer. When the axis of ordinates 31 represents a ratio of good quality components and it is assumed that reduction of yield due to failures of minute size occurs at the time of ws, the ratio of good quality components is changed as shown by curve 34. Numeral $33_1$ to $33_n$ represent extracted wafers of the wafers conveyed in the manufacturing line in order to examine the wafer. FIG. 13 shows the case where the inspection apparatus having the low capture ratio is used for the high frequency, and even if failure occurs, the failure cannot be recognized during the period 37 extending to a detection time 36 of failure since the capture ratio is low, so that a failed wafer is fabricated. An area 39 between a forecasted line 35 for the ratio of good quality components and the curve 34 represents the fabricated failed wafers caused by the inspection apparatus. Numeral 38 represents a period until a countermeasure is performed after the failure is detected.

FIG. 14 shows the case where the inspection apparatus is used with a low inspection frequency. Similarly to FIG. 13, the axis of abscissas 30 represents a feeding order indicated by w1 to wn of wafers conveyed in the manufacturing line and a vertical bar or line 32 represents feeding of one wafer. When the axis of ordinates 31 represents a ratio of good quality components and it is assumed that reduction of yield due to failures occurs at the time of ws, the ratio of good quality components is changed as shown by curve 34. Even if large failure which can be easily detected occurs, the failure cannot be recognized during the period 37 extending to a time 36 that the wafer is inspected by the inspection apparatus since the inspection apparatus is used with the low inspection frequency, and a failed wafer is fabricated. An area 39 between a forecasted line 35 for the ratio of good quality components and the curve 34 represents the fabricated failed wafers caused by the inspection apparatus.

FIG. 13 shows the case where one wafer is extracted every two fed wafers and FIG. 14 shows the case where one wafer is extracted every five fed wafers to be inspected.

For the cost Ci required for the inspection, the cost Cs required for an inspection a time is first calculated on the basis of data including a cost of the inspection apparatus, a maintenance cost of the inspection apparatus, an operating time of the inspection apparatus, a throughput upon inspection for the whole surface (the inspection area ratio of 100%) and the inspection area ratio in accordance with the following equation (9):

$$\text{Inspection cost (Cs) at one time} = f1 \text{ (inspection apparatus cost, inspection apparatus maintenance cost, inspection apparatus operating time, throughput upon inspection for the whole surface and the like)} \times f2 \text{ (inspection area ratio)} \quad (9)$$

where f1 and f2 are functions.

Then, the number of times for inspections N1 performed until a failed wafer is inspected is calculated on the basis of statistically calculated failure occurrence frequency (interval) Mf and inspection frequency Fr (extraction interval for inspection) (equation (10)) and further the average number of times for inspections N2 after a failed wafer is extracted until the wafer is recognized as failure is calculated (equation (11)), so that the final inspection cost is calculated on the basis of the calculated numbers N1 and N2 (equation (12)).

$$N1 = Mf/Fr \quad (10)$$

$$N2 = f3 \text{ (probability of detection)} \quad (11)$$

$$\text{Inspection cost (Ci) } Cs \times (N1+N2) \quad (12)$$

where f3 is a function.

The probability of detection (probability for recognizing a failed wafer as failure by inspecting the failed wafer) is calculated on the basis of the inspection area ratio (ratio of the number of inspected chips to the total number of chips), a management standard (for example, ratio of failed chips), the capture ratio and the like (equation (13)):

$$\text{Probability of Detection} = f4 \text{ (inspection area ratio, management standard, capture ratio and others)} \quad (13)$$

where f4 is a function.

On the other hand, the expected loss value due to fabricated failures Cf is calculated on the basis of the cost of the wafer, the inspection frequency Fr (extraction interval for inspection), the average number of times for inspections N2 after a failed wafer is extracted until the wafer is recognized as failure, the term from detection of a failure to completion of a countermeasure and the like (equation (14)):

$$\text{Expected Loss Value due to Fabricated Failures (Cf)} = f5 \text{ (wafer cost, inspection frequency, countermeasure term, throughput of manufacturing apparatus and others)} \quad (14)$$

where f5 is a function.

Figure 15:
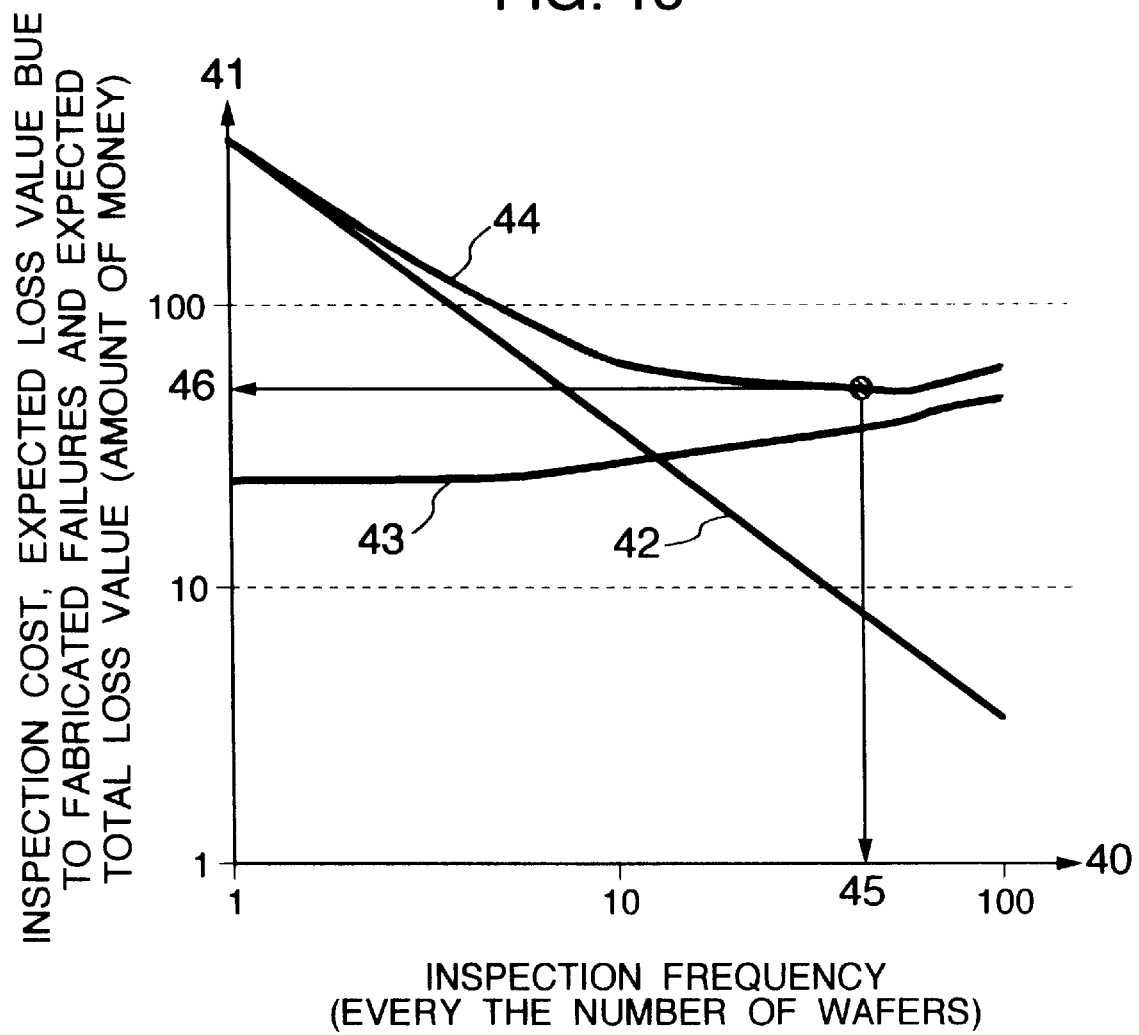
FIG. 15 is a graph explaining calculation of an expected total loss value.

FIG. 15 shows a graph having the axis of abscissas 40 representing the inspection frequency Fr (extraction intervals for inspection) and the axis of ordinates 41 representing the inspection cost Ci, the expected loss value due to fabricated failures Cf and the expected total loss value Ct, both axes being expressed by the logarithm. The inspection cost Ci is reduced as the inspection frequency is reduced (extraction intervals for inspection is lengthened) as shown by 42. On the other hand, the expected loss value due to fabricated failures Cf is increased as the inspection frequency is reduced (extraction intervals for inspection is lengthened) as shown by 43. Accordingly, the expected total loss value Ct is calculated by addition of both the values Ci and Cf as shown by 44. Thus, the inspection frequency Fr (extraction intervals for inspection) at the time that the expected total loss value Ct is the minimum value 46 is the optimum inspection frequency 45.

Figure 16:
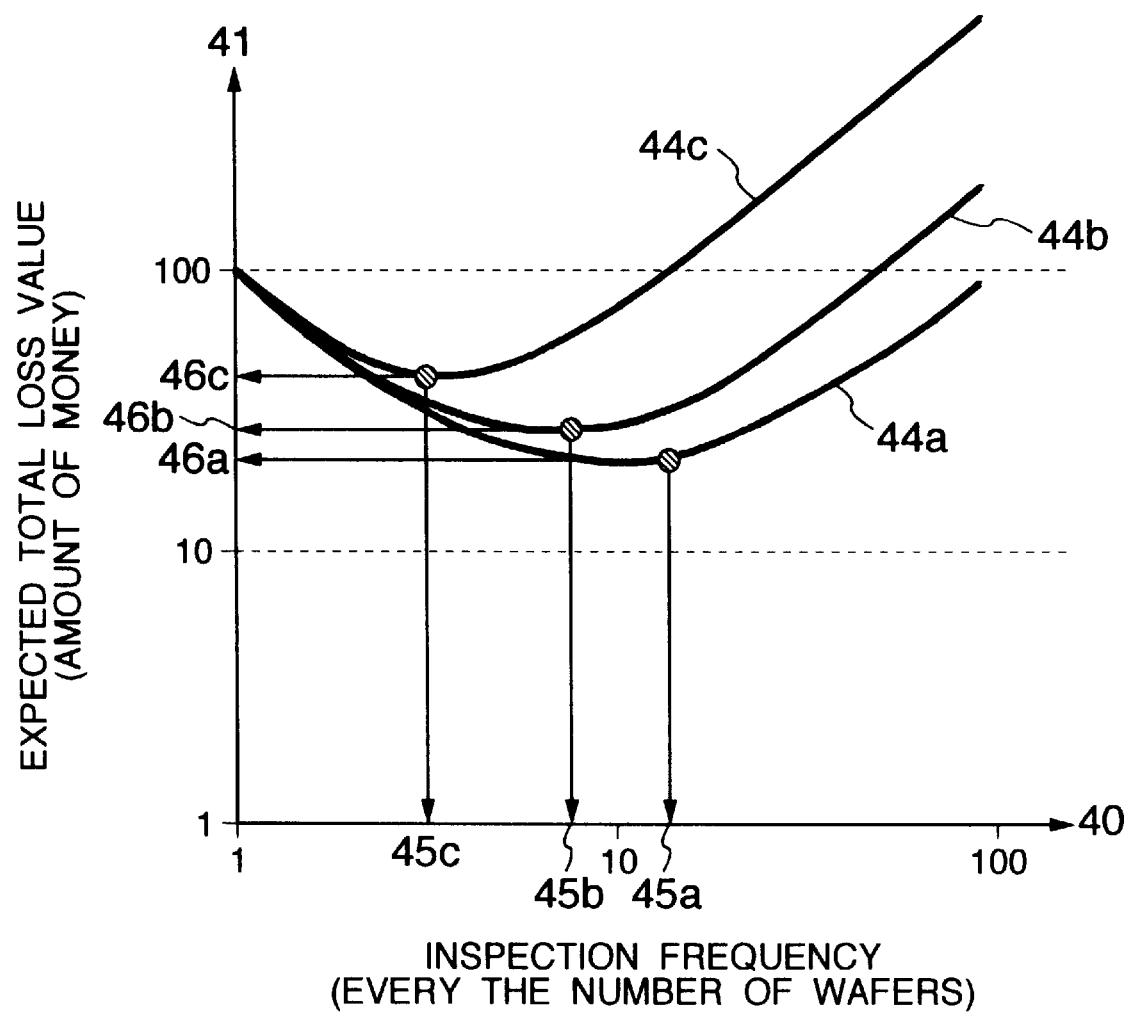
FIG. 16 is a graph for explaining a method of optimizing inspection conditions in accordance with situations.

FIG. 16 shows a graph having the axis of abscissas 40 representing the inspection frequency Fr (extraction intervals for inspection) and the axis of ordinates 41 representing the expected total loss value Ct with the capture ratio being changed as parameter. The minimum value of the expected total loss value is increased as shown by 46a to 46c as the capture ratio of the inspection apparatus is reduced as shown by 44a to 44c. On the other hand, it is understood that the optimum inspection frequency is also required to be increased as shown by 45a to 45c.

Figure 17:
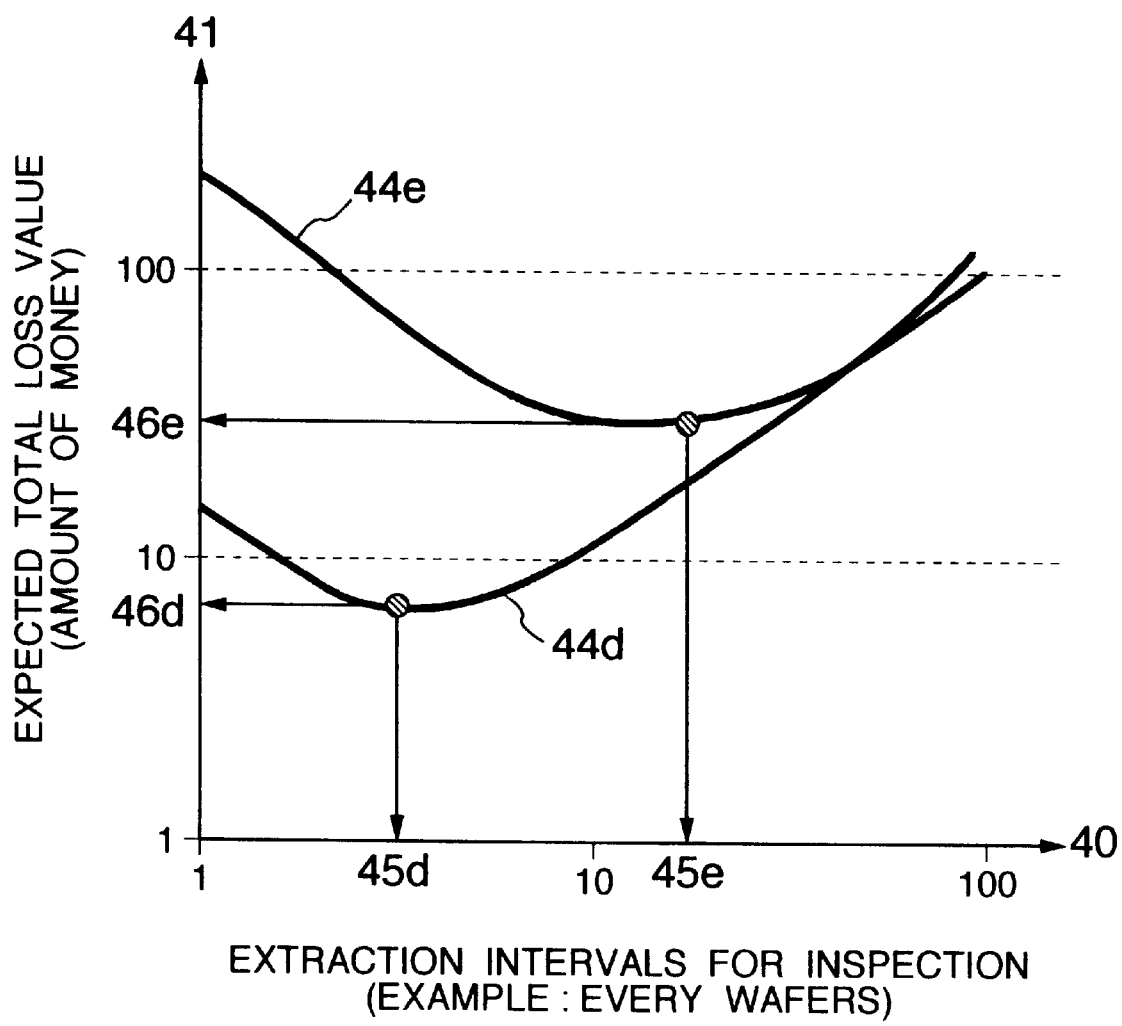
FIG. 17 is a graph for explaining a method of optimizing inspection conditions in accordance with situations.

FIG. 17 shows a graph having the axis of abscissas 40 representing the inspection frequency Fr (extraction intervals for inspection) and the axis of ordinates 41 representing the expected total loss value Ct plotted for two different inspection apparatuses in consideration of the capture ratio. In this case, the case 44d where an inexpensive inspection apparatus having the high throughput is used to set the inspection frequency to 45d can reduce the expected total loss value Ct as compared with the case (44e) where the expensive inspection apparatus having the low throughput is used.

Accordingly, the capture ratio of varying failure modes is calculated by the inter-apparatus correlation degree calculation process 4 of FIG. 4 and the failure occurrence frequency is calculated by the failure occurrence frequency calculation process 5 of FIG. 4 so that the expected total loss value Ct is calculated to thereby be able to set the optimum inspection apparatus and inspection frequency in real time.

Figure 18:
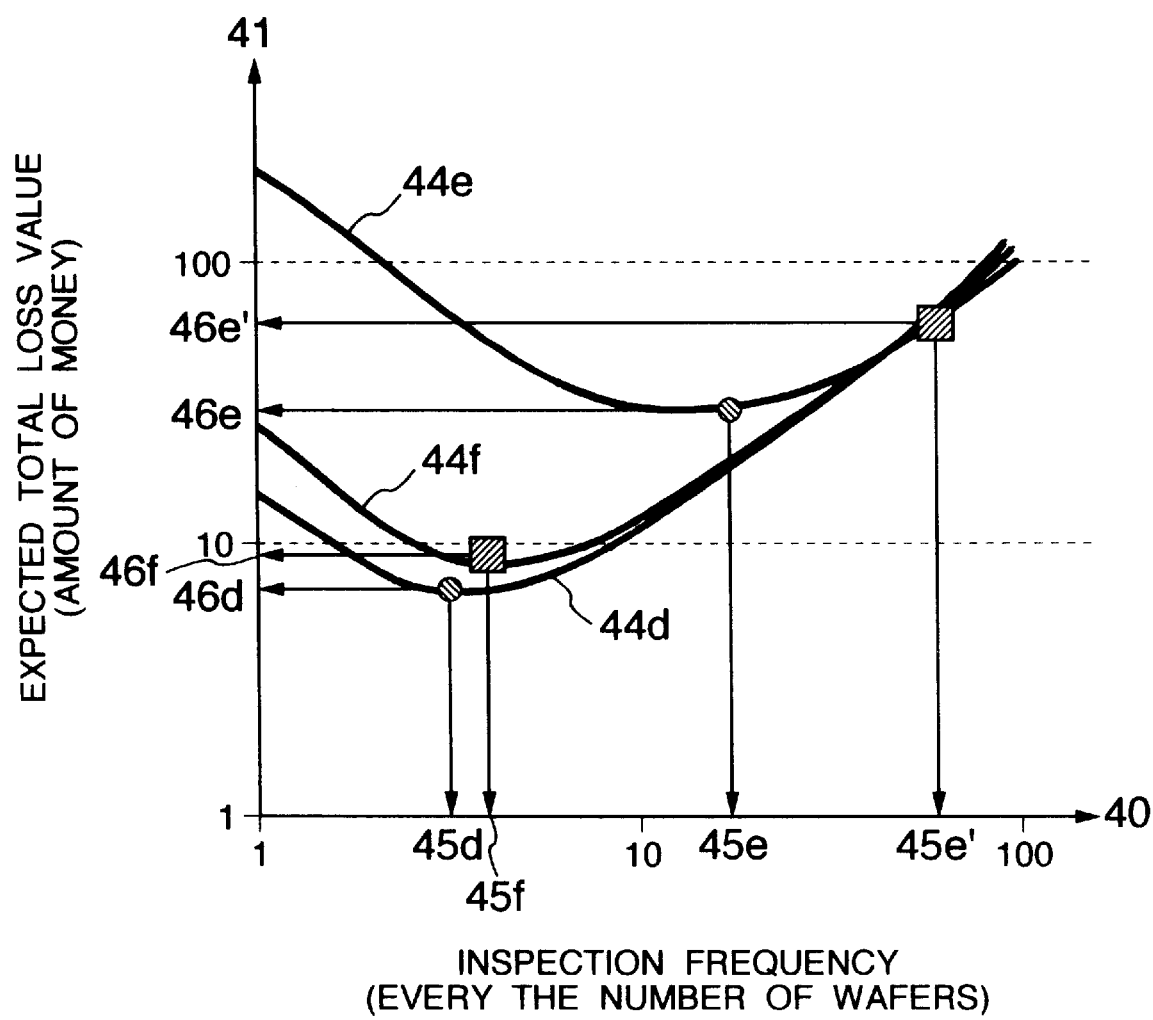
FIG. 18 is a graph for explaining a method of optimizing inspection conditions in accordance with situations.

FIG. 18 shows how to cope with the unknown failure mode. As shown in FIGS. 13 and 14, only the inspection with the low capture ratio and the high frequency or only the inspection with the high capture ratio and the low frequency is sometimes ineffective for unknown undetection of failure. Thus, the inspection method which covers the defects of both the methods is important.

The inspection apparatus 44*d* with the low capture ratio and the high frequency obtains the expected total loss value 46*d* originally when the inspection frequency is set to 45*d*. However, the inspection apparatus cannot detect minute failures. In order to detect minute failures, the inspection apparatus with the high capture ratio is required, while as shown by 44*e*, in certain cases, the expected total loss value 46*e* in the case where the inspection frequency is set to 45*e* is larger than the expected total loss value 46*d* in the case where the inspection apparatus with the low capture ratio and the high frequency is used. Accordingly, the inspection frequency of the inspection apparatus with the high capture ratio is reduced to 45*e*' to use the inspection apparatus with the high capture ration together with the inspection apparatus with the low capture ratio and the high frequency (44*f*), so that the optimum inspection frequency 45*f* of the inspection apparatus with the low capture ratio and the expected total loss value 46*f* at this time can be obtained.

In this manner, the optimum inspection apparatus and inspection frequency are obtained successively (optimum apparatus and inspection frequency calculation process 6) and the feeding method of wafers to the inspection apparatus group 1 is indicated and controlled through the inspection apparatus group management system 7.

Figure 19:
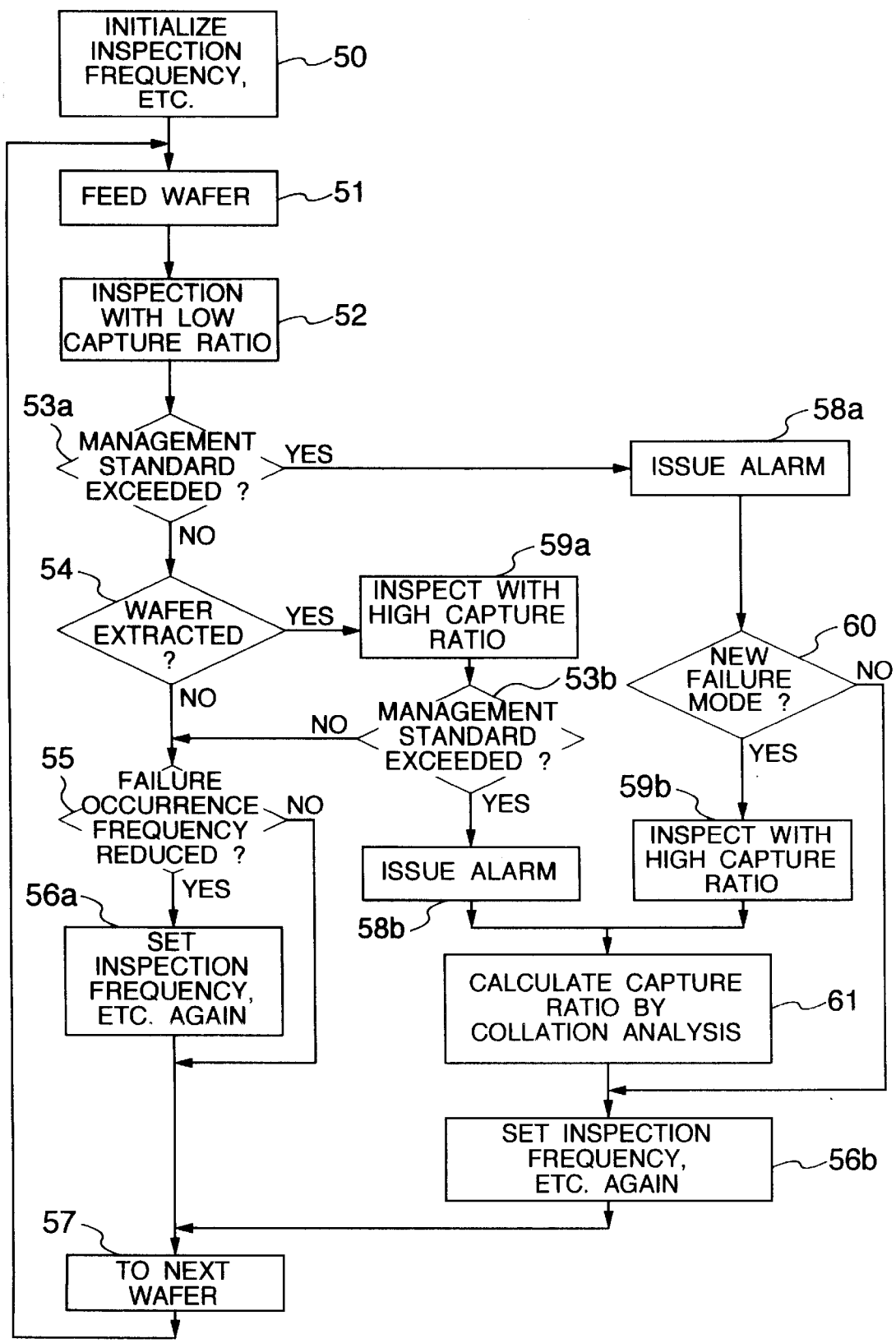
FIG. 19 is a flow chart showing the production management method of electronic components according to the present invention.

FIG. 19 is a flow chart showing the inspection method according to the present invention. First, the feeding method of wafers to the inspection apparatuses such as the inspection frequency is initialized on the basis of the past experience and the like (step 50). A wafer is fed (step 51) and inspection at high frequency is performed by the inspection apparatus with the low capture ratio (low sensitivity) (step 52). The inspected result is compared with the management standard (step 53*a*) and when the management standard is exceeded, an alarm is issued (step 58*a*). When the failure mode is new (step 60), detailed inspection is performed by the inspection apparatus with the high capture ratio (high sensitivity) (step 59*b*). Thereafter, the capture ratio between the inspection apparatuses and the like are calculated by the collation analysis (step 61) and further the inspection frequency and the like is set again (step 56*b*). Then, the inspection proceeds to a next wafer (step 57).

In the case of the conventional failure mode, the inspection frequency and the like are set again (step 56*b*) and the inspection proceeds to a next wafer (step 57).

In the comparison with the management standard (step 53*a*), when the management standard is not exceeded, wafers are extracted at regular intervals (step 54) and inspection is performed by the inspection apparatus with the high capture ratio (high sensitivity) (step 59*a*).

The inspected result is compared with the management standard (step 53*b*) and when the standard is exceeded, an alarm is issued (step 58*b*) and the capture ratio between the apparatuses and the like are calculated by the collation analysis (step 61). Further, the inspection frequency and the like are set again (step 56*b*) and the inspection proceeds to a next wafer (step 57).

The inspected result is compared with the management standard (step 53*b*) and when the standard is not exceeded, the presence of reduction of the failure occurrence frequency is examined (step 55). When the frequency is reduced, the inspection frequency and the like are set again (step 56*b*) and the inspection proceeds to a next wafer (step 57).

In the embodiment of the present invention, the inspection of extraneous substances on the semiconductor wafer or defects in external appearance has been described by way of example, while physical data such as a width of line, a thickness of film and color can be also inspected similarly. For example, by substituting the inspection apparatus with the low capture ratio of the embodiment by a relative variation measuring monitor and substituting the inspection apparatus with the high capture ratio by a high-sensitive absolute value measuring apparatus, the same method can be attained.

Further, the product to be inspected is not limited to the semiconductor wafer and the present invention can be applied to the production management of electronic components in the wide range including printed boards, TFT liquid crystal display units, plasma display units, magnetic disk boards and the like.

As described above, according to the present invention, in the manufacturing of electronic components such as semiconductor wafers, printed boards, TFT liquid crystal display units, plasma display units, magnetic disk boards and the like, complicated inspection conditions such as the inspection apparatus to be applied, the inspection frequency and the like can be set easily and the expected total loss value can be minimized to thereby improve the economical efficiency of inspection greatly.

What is claimed is:

1. A method of quality control for electronic components in a manufacturing line of said electronic components provided with a plurality of processing processes and a plurality of inspection apparatuses, said method comprising the steps of:

selecting an inspection apparatus to be used out of said plurality of inspecting apparatus for inspecting the electronic components passed through a desired processing process out of said plurality of processing processes in accordance with a performance of said inspection apparatus;

inspecting said electronic components passed through said desired processing process by using said selected inspection apparatus; and deriving a function of inspection frequencies set for respective inspection apparatuses and an expected total loss value when inspection is made at the inspection frequencies of said inspection apparatuses, and resetting the inspection frequencies of said inspection apparatuses so that said expected total loss value is minimized.

2. A method of quality control for electronic components according to claim 1, further comprising the step of calculating said expected total loss value in consideration of a cost required for inspection of said inspection apparatus and a loss cost due to fabricated failure manufactured until a failed electronic component is inspected.

3. A method of quality control for electronic components according to claim 2, wherein said electronic components include semiconductor devices or liquid crystal display devices, and said inspection apparatuses include extraneous substance inspection apparatuses or external appearance inspection apparatuses.

4. A method of quality control for electronic components in a manufacturing line of said electronic components provided with a plurality of processing processes and a plurality of inspection apparatuses, said method comprising the steps of:

selecting an inspection apparatus to be used out of said plurality of inspecting apparatus for inspecting the electronic components passed through a desired processing process out of said plurality of processing processes in accordance with a performance of said inspection apparatus;

inspecting said electronic components passed through said desired processing process by using said selected inspection apparatus;

calculating a correlation in performance among said plurality of inspection apparatuses on a basis of inspected data obtained by inspecting failure of the electronic components by using said plural inspection apparatuses; and calculating an expected loss value due to a fabricated failure on a basis of said correlation in performance obtained by said step of calculating the correlation.

5. A method of quality control for electronic components according to claim 4, wherein said the step of selecting the inspection apparatus includes selecting the inspection apparatus which is provided with a failure detection level necessary for inspecting the failure of the electronic component on the basis of the inspection data obtained by the step of calculating the correlation.

6. A method of quality control for electronic components according to claim 5, wherein said data obtained by the step of calculating the correlation includes a size of defect of the inspected electronic component and said failure detection level has a detection sensitivity capable of detecting a predetermined size of defect.

7. A method of quality control of electronic components in a manufacturing line of said electronic components provided with a plurality of processing processes, said method comprising the steps of:

setting at least one of an inspection frequency and performance of an inspection apparatus for inspecting said electronic components passed through a desired processing process out of said plural processing processes, in accordance with a failure mode and a failure occurrence frequency;

inspecting said electronic components passed through said desired processing process by using said inspection apparatus on the basis of said at least one of said inspection frequency and performance set by said step for setting said at least one of said inspection frequency and performance;

calculating a function of said inspection frequency set to said inspection apparatus and an expected total loss value when said electronic component is inspected by said inspection frequency; and resetting the inspection frequency of said inspection apparatus so that said expected total loss value is minimized.

8. A method of quality control of electronic components according to claim 7, further comprising the step of calculating said expected total loss value in consideration of a cost required for inspection of said inspection apparatus and a loss cost due to fabricated failure manufactured until a failed electronic component is inspected.

9. A method of quality control of electronic components according to claim 8, wherein said electronic components include semiconductor devices or liquid crystal display devices, and said inspection apparatus includes an extraneous substance inspection apparatus or an external appearance inspection apparatus.

10. A manufacturing apparatus using a method of quality control for electronic components in the manufacturing line of said electronic components provided with a plurality of processing processes and a plurality of inspection apparatuses, comprising:

means for selecting an inspection apparatus to be used out of said plurality of inspection apparatuses in accordance with an inspection process for inspecting said electronic components;

means for setting a ratio of extraction for an extraction inspection of said electronic components suitably; and means for deriving a function of inspection frequencies set for respective inspection apparatuses and an expected total loss value when inspection is made at the inspection frequencies of said inspection apparatuses; and means for resetting the inspection frequencies of said inspection apparatuses so that said expected total loss value is minimized.

11. A manufacturing apparatus according to claim 10, further comprising means for calculating said expected total loss value in consideration of a cost required for inspection of said inspection apparatus and a loss cost due to fabricated failure manufactured until a failed electronic component is inspected.

12. A manufacturing apparatus using a method of quality control for electronic components in the manufacturing line of said electronic components provided with a plurality of processing processes and a plurality of inspection apparatuses, comprising:

means for selecting an inspection apparatus to be used out of said plurality of inspection apparatuses in accordance with an inspection process for inspecting said electronic components; and means for setting a ratio of extraction for an extraction inspection of said electronic components suitably;

wherein said electronic components include semiconductor devices or liquid crystal display devices, and said inspection apparatuses include extraneous substance inspection apparatuses or external appearance inspection apparatuses.

13. A manufacturing apparatus using a method of quality control for electronic components in the manufacturing line of said electronic components provided with a plurality of processing processes and a plurality of inspection apparatuses, comprising:

means for selecting an inspection apparatus to be used out of said plurality of inspection apparatuses in accordance with an inspection process for inspecting said electronic components;

means for setting a ratio of extraction for an extraction inspection of said electronic components suitably; and means for calculating a correlation in performance among said plurality inspection apparatuses on a basis of inspected data obtained by inspecting failure of said electronic components by using said plurality of inspection apparatuses; and means for calculating an expected loss value due to said fabricated failure on the basis of said correlation in performance obtained by said means for calculating the correlation.

14. A manufacturing apparatus according to claim 13, wherein said means for selecting the inspection apparatus selects the inspection apparatus which is provided with a failure detection level necessary for inspecting the failure of the electronic components on the basis of the inspection data obtained by the means for calculating the correlation.

15. A manufacturing apparatus according to claim 14, wherein said inspection data obtained by the means for calculating the correlation includes a size of defect of the inspected electronic component and said failure detection level has a detection sensitivity capable of detecting a predetermined size of defect.

16. A manufacturing apparatus using a method of quality control for electronic components in the manufacturing lines of said electronic components provided with a plurality of processing processes and a plurality of inspection apparatuses, comprising:

means for selecting an inspection apparatus to be used out of said plurality of inspection apparatus for inspecting the electronic components passed through a desired processing process out of said processing processes in accordance with a performance of said inspection apparatus;

means for inspecting said electronic components passed through said desired processing process by using said selected inspection apparatus;

means for deriving a function of inspection frequencies set for respective inspection apparatuses and an expected total loss value when inspection is made at the inspection frequencies of said inspection apparatuses; and means for resetting the inspection frequencies of said inspection apparatuses so that said expected total loss value is minimized.

17. A manufacturing apparatus according to claim 16, further comprising means for calculating said expected total loss value in consideration of a cost required for inspection of said inspection apparatus and a loss cost due to fabricated failure manufactured until a failed electronic component is inspected.

18. A manufacturing apparatus according to claim 17, wherein said electronic components include semiconductor devices or liquid crystal display devices, and said inspection apparatuses include extraneous substance inspection apparatuses or external appearance inspection apparatuses.

19. A manufacturing apparatus using a method of quality control for electronic components in the manufacturing lines of said electronic components provided with a plurality of processing processes and a plurality of inspection apparatuses, comprising:

means for selecting an inspection apparatus to be used out of said plurality of inspection apparatus for inspecting the electronic components passed through a desired processing process out of said processing processes in accordance with a performance of said inspection apparatus;

means for inspecting said electronic components passed through said desired processing process by using said selected inspection apparatus;

means for calculating a correlation in performance among said plurality of inspection apparatuses on a basis of inspected data obtained by inspecting failure of the electronic components by using said plurality of inspection apparatuses; and means for calculating an expected loss value due to a fabricated failure on a basis of said correlation in performance obtained by means for calculating the correlation.

20. A manufacturing apparatus according to claim 19, wherein said means for selecting the inspection apparatus selects the inspection apparatus which is provided with a failure detection level necessary for inspecting the failure of the electronic components on the basis of the inspection data obtained by said means for calculating the correlation.

21. A manufacturing apparatus according to claim 20, wherein said inspection data obtained by said means for calculating the correlation includes a size of defect of the inspected electronic component and said failure detection level has a detection sensitivity capable of detecting a predetermined size of defect.

22. A manufacturing apparatus using a method of a quality control of electronic components in the manufacturing line of said electronic components provided with a plurality of processing processes, comprising:

means for setting at least one of an inspection frequency and performance of the inspection apparatus for inspecting the electronic components passes through a desired processing process out of said plural processing processes, in accordance with a failure mode and a failure occurrence frequency;

means for inspecting said electronic components passed through said desired processing process by using said inspection apparatus on a basis of said at least one of said inspection frequency and performance set by said means for setting said at least one of said inspection frequency and performance;

means for calculating a function of said inspection frequency set to said inspection apparatus and an expected total loss value when said electronic component is inspected by said inspection frequency; and means for resetting the inspection frequency of said inspection apparatus so that said expected total loss value is minimized.

23. A manufacturing apparatus according to claim 22, further comprising means for calculating said expected total loss value in consideration of a cost required for inspection of said inspection apparatus and a loss cost due to fabricated failure manufactured until a failed electronic component is inspected.

24. A manufacturing apparatus according to claim 22, wherein said electronic components include semiconductor devices or liquid crystal display devices, and said inspection apparatuses include extraneous substance inspection apparatuses or external appearance inspection apparatuses.

25. A manufacturing apparatus according to claim 11, wherein said electronic components include semiconductor devices or liquid crystal display devices, and said inspection apparatuses include extraneous substance inspection apparatuses or external appearance inspection apparatuses.

* * * * *